United States Patent [19]

Farrall et al.

[11] Patent Number: 4,620,124

[45] Date of Patent: Oct. 28, 1986

[54] SYNCHRONOUSLY OPERABLE ELECTRICAL CURRENT SWITCHING APPARATUS HAVING INCREASED CONTACT SEPARATION IN THE OPEN POSITION AND INCREASED CONTACT CLOSING FORCE IN THE CLOSED POSITION

[75] Inventors: George A. Farrall, Rexford; John H. Van Noy, Ballston, both of N.Y.

[73] Assignee: General Electric Company, Schenectady, N.Y.

[21] Appl. No.: 684,880

[22] Filed: Dec. 21, 1984

[51] Int. Cl.[4] .............................................. H01L 41/08
[52] U.S. Cl. .............................................. 310/332; 200/181
[58] Field of Search .............................................. 310/330–332; 200/181

[56] References Cited

U.S. PATENT DOCUMENTS

| | | | |
|---|---|---|---|
| 2,166,763 | 7/1939 | Mason | 175/320 |
| 2,182,340 | 12/1939 | Hearn | 178/71 |
| 2,471,967 | 5/1949 | Mason | 171/327 |
| 2,714,642 | 8/1955 | Kinsley | 310/332 |
| 2,835,761 | 5/1958 | Crownover | 200/87 |
| 3,292,111 | 12/1966 | Cotton | 335/3 |
| 3,381,226 | 4/1968 | Jones et al. | 328/3 |
| 3,486,042 | 12/1969 | Watrous | 307/252 |
| 3,688,135 | 8/1972 | Koda et al. | 310/8.5 |
| 3,949,246 | 4/1976 | Lohrmann | 310/332 |
| 4,074,333 | 2/1978 | Murakami et al. | 361/13 |
| 4,093,883 | 6/1978 | Yamamoto | 310/332 X |
| 4,395,651 | 7/1983 | Yamamoto | 310/331 X |
| 4,403,166 | 9/1983 | Tanaka et al. | 310/332 X |

FOREIGN PATENT DOCUMENTS

| | | | |
|---|---|---|---|
| 273157 | 7/1964 | Australia | 200/181 |
| 0060005 | 5/1977 | Japan | 310/332 |
| 421067 | 8/1974 | U.S.S.R. | 200/181 |

*Primary Examiner*—Mark O. Budd
*Attorney, Agent, or Firm*—Jeffrey L. Brandt; James C. Davis, Jr.; Paul R. Webb, II

[57] ABSTRACT

A synchronously operable, piezoelectrically actuated electrical current switching apparatus is provided which has increased separation between the switching contacts when they are in the open position, and increased contact closing force when they are in the closed position. The apparatus includes a pair of spaced-apart, opposing multimorph piezoelectric benders and at least one pair of electrical current switching contacts mounted on the opposing surfaces of the pair of benders, with one contact being mounted on each of the surfaces. The benders are disposed so that they bend toward each other in response to a first electrical signal, moving the contacts to a closed position. In response to a second electrical signal, the benders bend away from each other and move the contacts to an open position. In this manner, the distance achievable between the contacts in the open position is greater than the displacement available from either of the benders alone. Preferably, the benders are also disposed so that the distance between the contacts, in the absence of any applied electrical signal, is less than the sum of the displacements available from the two benders. The principles of the invention may be extended to a set of three piezoelectric benders, configured similarly to the manner described above, so that a three-position switch is provided.

12 Claims, 7 Drawing Figures

SYNCHRONOUSLY OPERABLE ELECTRICAL CURRENT SWITCHING APPARATUS HAVING INCREASED CONTACT SEPARATION IN THE OPEN POSITION AND INCREASED CONTACT CLOSING FORCE IN THE CLOSED POSITION

RELATED APPLICATIONS

This patent application is related to application Ser. Nos. 684,881, 684,882, 685,107, 685,108, and 685,109, all assigned to the present assignee and filed concurrently herewith.

BACKGROUND OF THE INVENTION

This invention relates to a piezoelectrically operated apparatus which is useful for switching electrical circuits. More particularly, it relates to piezoelectric circuit elements which are specially constructed to have a combination of increased separation between the switching contacts when the contacts are in the open position and increased closing force when the contacts are in the closed position.

Electromagnetic relays have been used in the past to switch a wide range of electrical circuits by separating or closing one or more pairs of electrical contacts. While electromagnetic relays perform satisfactorily for some applications, they can be slow acting, relatively large in size, and costly. They typically require a relatively bulky solenoid coil and associated linkage to provide contact movement. Such coil and linkage systems are, in addition to being a major part of the relay cost, generally energy inefficient. Furthermore, electromagnetic relays do not lend themselves to synchronous operation. Although conventional electromagnetic relays may be employed to switch such loads as, for example, an alternating current electrical circuit on demand, the movement of the contacts is usually random on the time scale of the load current waveform, because of generally long mechanical reaction times associated with the operation of such relays. As a result, opening and closing operations of the contacts are not synchronized with the zero current points of the current waveform, especially when the load is an alaternating current circuit. For electrical circuits operating at current levels typical of such power sources as household electrical wiring, opening and closing of the relay contacts is often accompanied by arcing between the contacts. When the current in such a circuit is interrupted, the current through the relay contacts does not drop to zero at the instant of contact separation, but rather persists in the form of an arc between the contacts, usually until the alternating current waveform approaches the next sinusoidal zero. As the current level decreases toward the sinusoidal zero point, the art becomes unstable and is suddenly extinguished, a phenomenon often referred to as chopping. This sudden extinction at low current represents an extremely high rate of change of current. As a result, if the electrical circuit in which the current is being interrupted has significant inductance, high voltage transients, proportional to the product of the inductance and the rate of change of the current, are produced. These voltage transients may cause electrical breakdown in either the equipment connected with the circuit, or the relay itself, or both. Moreover, such arcing is damaging to the contacts themselves and can cause contact erosion and contact welding. It is therefore desirable to minimize any arcing occurring between the relay contacts when the contacts are opened or closed. One way to minimize such arcing is to operate the relay so as to switch the electrical circuit at a point in the load current waveform where the current level is as close to zero as possible, which operation is referred to hereinafter as synchronous operation.

A piezoelectric device, utilizing the fast action capability of a piezoelectric bender, may be employed to provide a synchronously operable switching relay. Synchronous operation requires that the relay contacts be moved between the open and closed positions in a relatively short period of time. The fast action, relatively low mass, and small travel distance of a piezoelectric bender facilitate the use of such a device in a synchronously operable relay. A further characteristic of a piezoelectric device is that the deflecting force acting to move the contacts is at a maximum at the beginning of the piezoelectric bender's deflection. This characteristic further enhances the device's capability of moving the relay contacts in a short period of time. With this fast action capability, a piezoelectric relay may be operated so that the contacts are opened or closed at a time very close to the time when the current level is zero in the circuit being switched, thereby substantially reducing contact erosion, contact welding, and transient inductive voltages. Also, the simplicity of a piezoelectric device avoids most of the mechanical problems of conventional electromagnetic relays, and the energy efficiency of such a device permits operation with far less expenditure of energy.

However, the displacement achievable for piezoelectric benders of small size is relatively small, especially if the bender is operated in a so-called "inchworm" configuration where the two ends of the bender remain fixed while the middle deflects in response to an applied electrical signal. For example, for a bender which is useful in a synchronously operable switching apparatus, the deflection achievable may be as little as 10-20 mils. For some applications, such small deflections may not provide sufficient contact separation to meet the dielectric strength requirements of the application involved. Furthermore, the contact closing force available from a piezoelectric bender is also relatively small, and the available force is at a minimum at the end of the bender's deflection. While the force characteristic of a piezoelectric bender, which is at a maximum at the beginning of the bender's travel and at a minimum at the end thereof, is useful for synchronously operating relay contacts, in that such force characteristic gives fast action capability, it also may result in lower residual forces in the closed position of the relay contacts, than is characteristic of an electromagnetic relay. If the residual closing force on the contacts is too small, the electrical resistance of the closed contact interface, conventionally referred to as contact resistance, for a particular circuit may be unacceptably high. High contact resistance results in excessive power loss at the contact interface, and the resistive heating at the interface can lead to a number of contact failure modes. For these reasons, the full displacement achievable by a piezoelectric bender is not available when the bender is employed in a switching apparatus. Instead, only a portion of the achievable displacement is used to provide contact separation, with the remainder being used to provide a residual closing force when the contacts are in the closed position.

Piezoelectric benders have been used in the past in a number of applications, including utilization in various piezoelectric relays. For example, piezoelectric benders used as relay elements are described in U.S. Pat. Nos. 2,166,763, 2,182,340, 2,471,967, 2,835,761, 4,093,883, and 4,403,166. However, none of the piezoelectric relays disclosed by these patents have been specifically designed to minimize arcing. No consideration has been given to providing a synchronously operable relay, or to one which is especially useful for switching electrical circuits operating at household power line current levels. As has been noted above, switching circuits operating at such current levels results in significant arcing if the circuit is not switched at a point in time close to a sinusoidal zero of the alternating current level. Application Ser. No. 684,881, assigned to the same assignee as the present invention and filed concurrently herewith, discloses a piezoelectric relay having a very small gap length as compared to the contact separation for conventional relays, which relay may be synchronously operated so that, for example, 110 volt alternating current circuits are switched on and off with minimal arcing between the relay contacts. Application Ser. No. 684,882, also assigned to the present assignee and filed concurrently herewith, discloses a synchronously operable electrical current switchng apparatus which employs a plurality of piezoelectric benders and which may be used to switch multiple circuits or to lower the contact resistance in one or a few circuits. The present invention provides a synchronously operable electrical current switching apparatus which provides increased separation between the switching contacts when the contacts are in the open position and increased closing force when the contacts are in the closed position.

It is seen from the above that it is an object of the present invention to provide a piezoelectrically actuated electrical current switching apparatus that exhibits increased contact separation when the contacts are in the open position and increased closing force when the contacts are in the closed position.

It is another object of the present invention to provide an electrical current switching apparatus which is fast acting, small in size, highly energy efficient, and low in cost.

It is also an object of the present invention to provide an electrical circuit switching apparatus which is synchronously operable.

SUMMARY OF THE INVENTION

A piezoelectrically actuated electrical current switching apparatus which has increased separation between the switching contacts when the contacts are in the open position, and increased contact closing force when the contacts are in the closed position, is provided. The switching apparatus of the present invention is especially useful for synchronous operation of the circuit being switched. The apparatus comprises a pair of spaced-apart, opposing multimorph piezoelectric benders and at least one pair of electrical current switching contacts. One of the contacts is mounted on a first one of the opposing surfaces of the pair of opposing benders, and the other contact is mounted on the second one of the opposing surfaces. The piezoelectric benders are disposed so that, in response to a first electrical signal, the benders bend toward each other and move the contacts to a closed position, and so that, in response to a second electrical signal, the benders bend away from each other and move the contacts to an open position. Preferably, the benders are disposed so that the distance between the contacts in the open position is greater than the displacement available from either of the benders alone, while the benders are also disposed so that the distance between the contacts, in the absence of any applied electrical signal, is less than the sum of the displacements available from the two benders. In an alternative embodiment of the present invention, three piezoelectric benders may be provided, configured similarly to the manner described above, so that a three-position switch is formed.

BRIEF DESCRIPTION OF THE DRAWINGS

The subject matter which is regarded as the invention is particularly pointed out and distinctly claimed in the concluding portion of the specification. The invention itself, however, both as to its organization and its method of practice, together with further objects and advantages thereof, may best be understood by reference to the following description taken in conjunction with the accompanying drawings, in which:

DETAILED DESCRIPTION OF THE PREFERRED EMBODIMENTS

Figure 1:
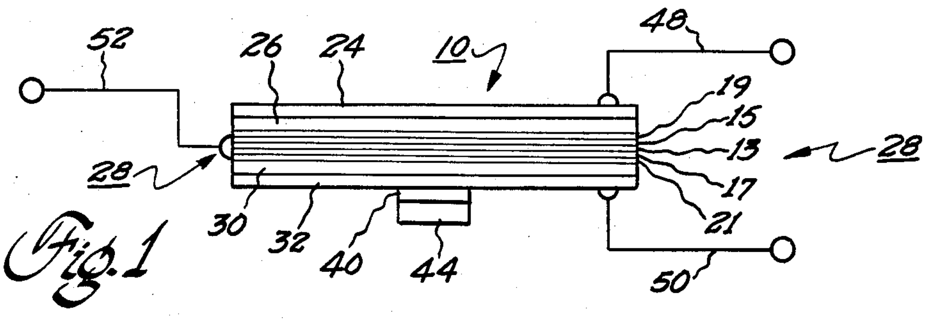
FIGS. 1 and 4 are side elevation views schematically illustrating typical piezoelectric benders useful in the present invention.

FIG. 1 is a side elevation view schematically illustrating a typical multimorph piezoelectric bender useful in one embodiment of the present invention. By the term "multimorph", it is meant that the piezoelectric bender comprises a sandwich formed of alternate layers of electrically conductive material and piezoelectric material, with the layers arranged in a parallel fashion. A multimorph bender employing two piezoelectric layers separated by an electrically conductive layer and having an electrically conductive layer adjacent the opposite side of each of the piezoelectric layers is usually referred to as a "bimorph" bender. As illustrated by the bimorph construction shown in FIG. 1, piezoelectric bender 10 preferably comprises central electrically conductive layer 28 separated from each of outer electrically conductive layers 24 and 32 by piezoelectric material layers 26 and 30, respectively. In the preferred embodiment of a piezoelectric bender shown in FIG. 1, central electrically conductive layer 28 comprises a 5-layer structure. In this 5-layer structure, spring member 13 provides a central flexible member to facilitate bending motion of the bender. Conductive epoxy layers 15 and 17 serve to fasten the two halves of the bender to central spring member 13. Central conductor layers 19 and 21 provide means for electrically connecting piezoelectric material layers 26 and 30 with external circuitry (not shown). Electrical conductors 48 and 50 are electrically connected to outer layers 24 and 32, respectively, and electrical conductor 52 is electrically connected to central layer 28. Electrically conductive layers 24 and 32 and piezoelectric material layers 26 and 30 are arranged so that a flat capacitor, having piezoelectric material as the dielectric, is formed between outer layer 24 and central layer 28, and a similar flat capacitor is formed between outer layer 32 and central layer 28. With this bimorph construction, bender 10 exhibits bending motion in a direction substantially perpendicular to the plane in which bender 10 lies, in response to a first electrical signal, and bending motion in the opposite direction in response to a second electrical signal. When one end of bender 10 is held fixed and a voltage is applied between outer layer 24 and central layer 28, the electric field across piezoelectric material layer 26 causes the free end of bender 10 to deflect upward. In a similar manner, a voltage applied between outer layer 32 and central layer 28 causes the free end of bender 10 to deflect downward. If both ends of the bender are held fixed and a voltage is applied either between layers 24 and 28 or between layers 32 and 28, the center of bender 10 bows upward or downward, respectively, in an inchworm configuration. Electrical current switching contact 44 is attached to outer electrically conductive layer 32 of piezoelectric bender 10. For applications where it is desirable to electrically isolate contact 44 from electrically conductive layer 32, contact mount 40 is provided between contact 44 and layer 32, and comprises an electrically insulative material.

Figure 2:
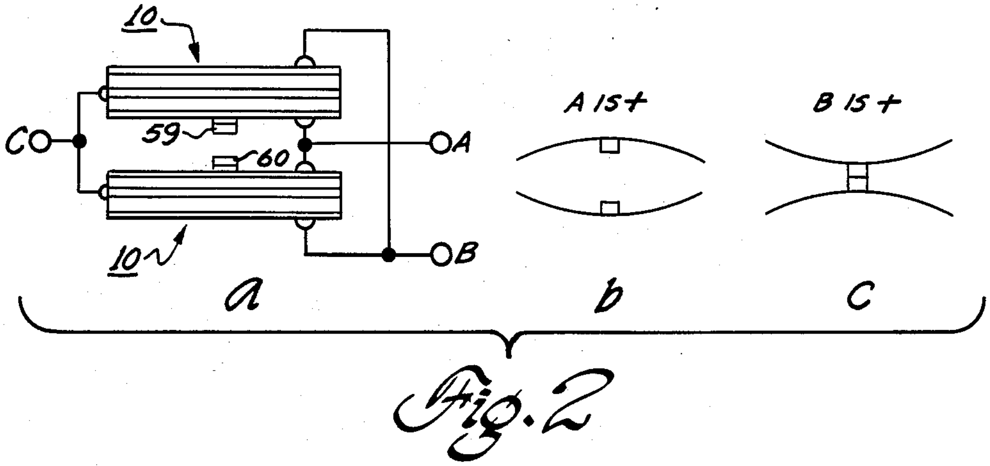
FIG. 2 is a side elevation view schematically illustrating one embodiment of the present invention.

In one embodiment of the present invention, schematically illustrated in FIG. 2*a*, a pair of multimorph piezoelectric benders 10 are arranged in a spaced-apart, opposing relationship. The piezoelectrically actuated electrical current switching apparatus shown therein further comprises at least one pair of electrical current switching contacts 59 and 60. Contacts 59 and 60 are mounted on benders 10 so that one of the contacts is mounted on one of the opposing surfaces of the pair of benders, and the second contact is mounted on the second one of the opposing surfaces. Contacts 59 and 60 and piezoelectric benders 10 are further disposed so that, in response to a first electrical signal, benders 10 bend toward each other and move contacts 59 and 60 to a closed position. Benders 10 are also configured so that, in response to a second electrical signal, benders 10 bend away from each other and move contacts 59 and 60 to an open position. It is known in the piezoelectric material arts that the direction in which piezoelectric bender 10 moves in response to an applied electrical signal depends upon the manner in which piezoelectric material layers 26 and 30 are "poled", and upon the polarity of the voltage applied at either conductor 48 or conductor 50 with respect to the voltage applied at conductor 52. Piezoelectric material layers 26 and 30 may be poled so that bender 10 moves downward when the voltage applied to conductor 48 is negative with respect to the voltage applied to conductor 52, and upward when the voltage at conductor 50 is negative with respect to the voltage applied to conductor 52. Alternatively, piezoelectric material layers 26 and 30 may be poled so that bender 10 moves downward when the voltage applied to conductor 48 is positive, and upward when the voltage applied to conductor 50 is positive, respectively, with respect to the voltage applied to conductor 52. In the discussion hereinbelow, only the latter poling arrangement is specifically referred to. However, it is to be understood that the principles of the present invention apply equally to other poling arrangements, with appropriate changes in the polarity of the associated electrical signals.

With piezoelectric material layers 26 and 30 of each piezoelectric bender 10 being poled in the manner noted above, and with benders 10 being electrically connected to each other in the manner shown in FIG. 2*a*, benders 10 bend away from each other in the manner shown in FIG. 2*b* when the electric potential at terminal A is made positive with respect to the electric potential at terminal C. If, instead, the electric potential at terminal B is made positive with respect to the electric potential at terminal C, benders 10 bend toward each other in the manner shown in FIG. 2*c*. By appropriately spacing the pair of benders 10 and contacts 59 and 60 from each other, the switching apparatus shown in FIG. 2*a* can be made to provide a larger separation between contacts 59 and 60 when they are in the open position, as compared with the contact separation achievable if only one bender 10 were employed. The apparatus can also be made to provide greater residual closing force on contacts 59 and 60 when they are in the closed position, than would be available from one piezoelectric bender 10 for the same contact travel distance. Preferably, a combination of increased contact separation and increased closing force is provided. With benders 10 arranged and electrically connected n the configuration shown in FIG. 2*a*, application of a positive voltage electrical signal to terminal A causes each bender 10 to bend away from the other. The sum of the two bending distances, and concommitantly the distance between contacts 59 and 60 in the open position, is greater than the bending distance available from either of piezoelectric benders 10 alone for the same triggering signal. If benders 10 are further disposed so that the distance between contacts 59 and 60, is the absence of any applied electrical signal, is less than the sum of the bending distances available from the pair of benders 10 when the positive voltage signal is applied to terminal B, then some of the bending distance available is "converted" to residual contact closing force. That is, contacts 59 and 60 move toward each other until they meet, at which point the remaining bending force produced by benders 10, which would otherwise continue to move contacts 59 and 60 toward each other if they were not already in the closed position, acts as a residual closing force on contacts 59 and 60 to hold them together. In a preferred embodiment, benders 10 are disposed so that the distance between contacts 59 and 60, in the absence of any applied electrical signal, is one-half the sum of the bending distances available from each of benders 10 in response to a positive voltage signal at terminal B. In this embodiment, one-half of the bending force available from benders 10 is used to move contacts 59 and 60 to the closed position, with the other one-half of the available bending force being used to hold contacts 59 and 60 together. When contacts 59 and 60 are signaled to open by applying a positive voltage electrical signal to terminal A, all of the bending distance available from benders 10 is used to move contacts 59 and 69 away from each other, so that the separation between contacts 59 and 60 in the fully open position is three times the distance between contacts 59 and 60 when no electrical signal is applied.

Figure 3:
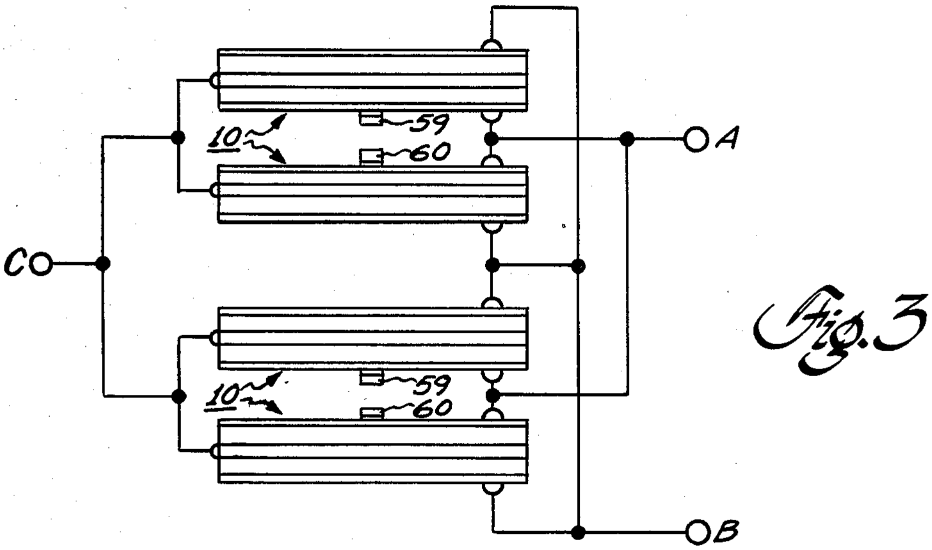
FIG. 3 is a side elevation view schematically illustrating another embodiment of the present invention.

A plurality of pairs of opposing multimorph piezoelectric benders in the configuration shown in FIG. 2*a* may be combined to provide multiple switching capability. Each pair of benders may be controlled by separate electrical signals, so that each pair forms an independent switching unit of single-pole single-throw configuration. Alternatively, two or more pairs of opposing benders may be electrically connected in the configuration shown in FIG. 3, so as to provide a multi-pole single-throw switch. In the embodiment schematically illustrated therein, application of a positive voltage signal to either terminal A or terminal B causes both pairs of contacts to open or close, respectively. Thus, this embodiment may be employed to provide simultaneous multiple switching capability. Each pair of contacts may be used to switch a separate circuit, or a number of contact pairs may be combined to switch a single circuit, in order to increase the voltage or current carrying capability in the switching apparatus or to reduce contact resistance for the circuit being switched. For example, a number of contact pairs may be electrically connected in series with the circuit being switched in order to improve the ability of the switching apparatus to withstand high voltage electrical breakdown; alternatively, the contact pairs may be electrically connected in parallel with the circuit being switched in order to enhance the current carrying capability of the switching apparatus and/or to reduce the contact resistance.

Figure 4:
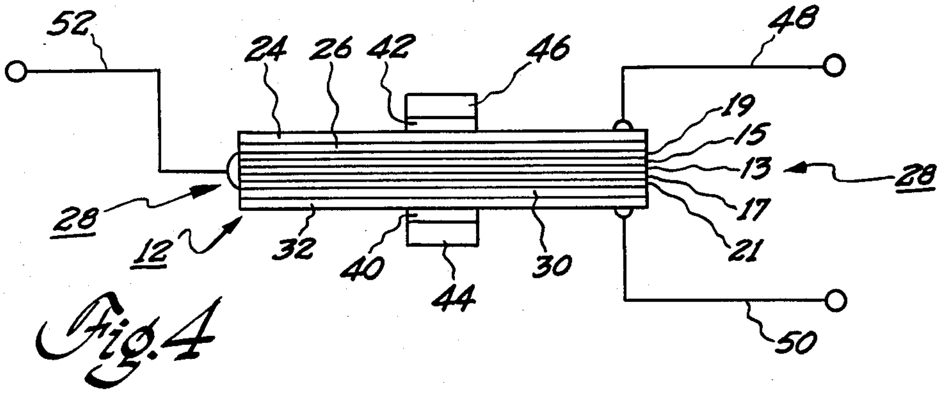
Figure 5:
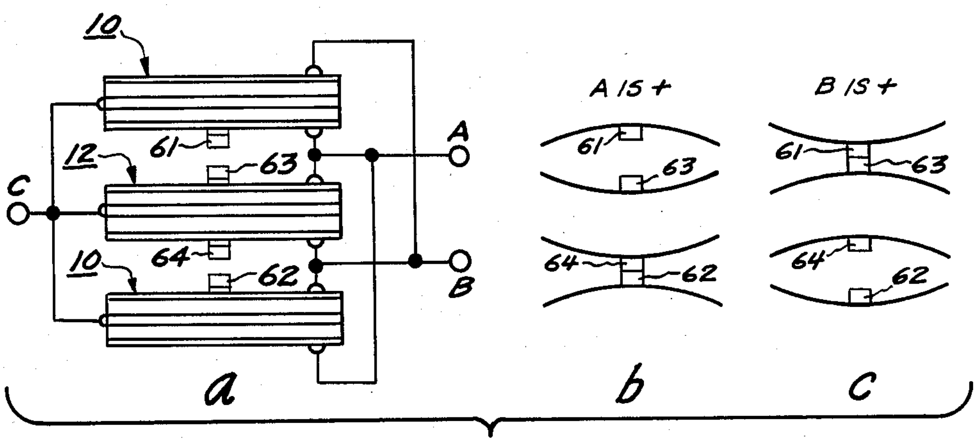
FIG. 5 is a side elevation view schematically illustrating yet another embodiment of the present invention.
Figure 6:
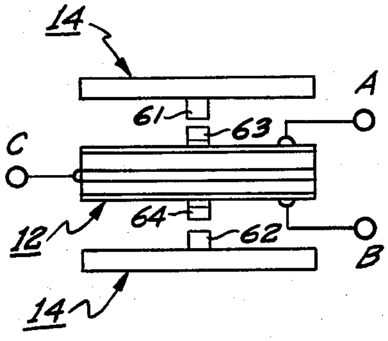
FIGS. 6 and 7 are side elevation views schematically illustrating alternative embodiments to that shown in FIG. 5.
Figure 7:
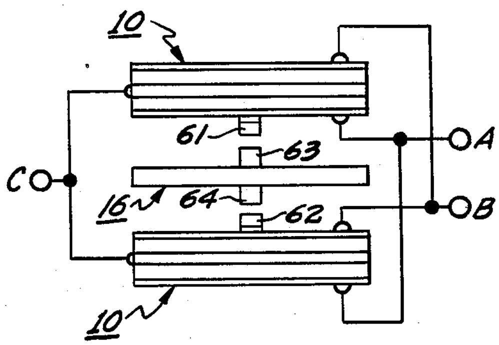

FIG. 4 is a side elevation view similar to that of FIG. 1, schematically illustrating a typical piezoelectric bender useful for the alternative embodiments of the present invention shown in FIGS. 5-7. Piezoelectric bender 12 is the same as piezoelectric bender 10, shown in FIG. 1 and discussd above in conjunction therewith, except for the addition of electrical current switching contact 46 and contact mount 42. Similar to contact mount 40, contact mount 42 may comprise electrically insulative material for applications where it is desirable to electrically isolate contact 46 from electrically conductive layer 24.

Piezoelectric benders 10 and 12 may be used in several combinations in order to form a three-position switch, as schematically illustrated by the embodiments shown in FIGS. 5-7. Preferably, as shown in FIG. 5*a*, such a piezoelectrically actuated electrical current switching apparatus comprises one piezoelectric bender 12 of the type shown in FIG. 4 and two piezoelectric benders 10 of the type shown in FIG. 1, with benders 10 located on opposite sides of bender 12 and spaced apart therefrom. The apparatus also comprises at least one set of four contacts, with first and second ones of the contacts being mounted on benders 10 so that one contact is mounted on each bender 10 and so that each contact faces bender 12. A third one of the contacts is mounted on the side of bender 12 which faces the first contact, and the fourth one of the contacts is mounted on the side of bender 12 which faces the second contact. For the embodiment shown in FIG. 5*a*, this set of four contacts may be comprised of two contacts 44, mounted one each on the two benders 10, and one contact 44 and one contact 46 mounted on bender 12. In order to avoid confusion in the following discussion, these contacts are shown as contacts 61-64. Piezoelectric bender 12 is disposed with respect to piezoelectric benders 10 so that, in response to a first electrical signal, bender 12 bends toward first contact 61 and moves first and third contacts 61 and 63 to a closed position while moving second and fourth contacts 62 and 64 to an open position. Bender 2 is also disposed with respect to benders 10 so that, in response to a second electrical signal, bender 12 bends toward second contact 62 and moves second and fourth contacts 62 and 64 to a closed position while moving first and third contacts 61 and 63 to an open position. With benders 10 and 12 being electrically connected to each other in the manner shown in FIG. 5*a*, bender 12 bends toward second contact 62, and moves second and fourth contacts 62 and 64 to a closed position while moving first and third contacts 61 and 63 to an open position, in the manner shown in FIG. 5*b*, when the electric potential at terminal A is made positive with respect to the electric potential at terminal C. If, instead, the electric potential at terminal B is made positive with respect to the electric potential at terminal C, bender 12 bends toward first contact 61, and moves first and third contacts 61 and 63 to a closed position while moving second and fourth contacts 62 and 64 to an open position, in the manner shown in FIG. 5*c*. In a manner similar to that discussed above for the apparatus shown in FIG. 2*a*, the switching apparatus shown in FIG. 5*a* can, by appropriately spacing bender 12 with respect to each of benders 10, be made to provide a larger separation between contact pair 61 and 63 and between contact pair 62 and 64 when the contact pairs are in the open position, as compared with the contact separation achievable if opposing pairs of piezoelectric benders were not employed. Also similarly to the manner discussed for the apparatus of FIG. 2, the apparatus of FIG. 5 can be made to provide greater residual closing force on each of the contact pairs when they are in the closed position. The apparatus can also be made to provide a combination of increased contact separation and increased closing force. In a preferred embodiment, bender 12 is disposed with respect to each of benders 10 so that, in the absence of any applied electrical signal, the distance between first and third contacts 61 and 63 is one-half the sum of the individual bending distances available from the benders to which contacts 61 and 63 are attached, in response to a positive voltage signal at terminal B. In a similar manner, the distance between second and fourth contacts 62 and 64 in the absence of any applied electrical signal is also one-half the sum of the individual bending distances available from bender 12 and from the bender to which second contact 62 is attached, in response to a positive voltage signal at terminal A.

FIGS. 6 and 7 are side elevation views schematically illustrating alternative embodiments for the apparatus shown in FIG. 5*a*. The embodiments of the present invention shown in FIGS. 6 and 7 are similar in structure and operation to the apparatus shown in FIG. 5*a*, except that various ones of the piezoelectric benders have been replaced by non-piezoelectric contact mounting structures. In the embodiment of FIG. 6, each of piezoelectric benders 10 is replaced by contact mounting structure 14. In the embodiment shown in FIG. 7, piezoelectric bender 12 is replaced by contact mounting structure 16. Contact mounting structures 14 and 16 serve to provide a support for various ones of electrical current switching contacts 61-64, and may comprise virtually any structure having the mechanical and electrical characteristics required for a particular application. While the embodiments shown in FIGS. 6 and 7 do not provide the same advantages in contact closing force and contact separation as exhibited by the embodiment of FIG. 5*a*, they readily lend themselves to multiposition switching which may be adequate for particular applications.

The embodiments illustrated in FIGS. 5-7 may be operated as either a two-position switch or a three-position switch. With the electrical interconnections shown, each of the embodiments may be employed as a single-pole, double-throw switch when either contacts 63 and 64 or contacts 61 and 62 are electrically connected to each other. Also, a plurality of the sets of benders or the sets of benders and contact mounting structures shown in FIGS. 5–7 may be combined to provide multiple switching capability. Each set of switching elements may be controlled by separate electrical signals, so that each set forms an independent switching unit. Alternatively, two or more sets may be electrically connected in a manner similar to that shown in FIG. 3, so as to provide a multi-pole, double-throw switch. Furthermore, a number of contact pairs may be combined to switch a single circuit, in order to increase the voltage or current carrying capability in the switching apparatus or to reduce contact resistance for the circuit being switched. For example, if contacts 63 and 64 of the switching apparatus shown in FIG. 7 are electrically isolated from one another, and if piezoelectric benders 10 are electrically connected to electrical control signals so that they may be activated separately from each other, the gaps between contacts 61 and 63 and between contacts 62 and 64 may be used in series in order to improve the ability of the switching apparatus to withstand high voltage in the circuit being switched. If, instead, it is desirable to enhance the current carrying capability of the switching apparatus, or to reduce the contact resistance, contacts 61 and 63 and contacts 62 and 64 may be electrically connected in parallel with the circuit being switched.

Synchronous operation of the electrical current switching apparatus provided by the present invention allows the use of such an apparatus to switch electrical circuits operating at significant current levels, while minimizing arcing between the current switching contacts. If the contacts are operated so that arcing is minimized, erosion of the contacts and the resulting changes in the gap between the contacts are also minimized. With the change in the gap between the contacts being minimized, no significant increase in contact travel distance is required over the operating life of the switching apparatus. The relatively short gap between the contacts which may be used in a synchronously operated switching apparatus in turn allows the contacts to be opened or closed in a short period of time, using a piezoelectric bender. As an example, and not by way of limitation, contacts having a separation of one mil may be opened or closed in about 200 microseconds. The speed with which such a switching apparatus may be operated allows true synchronous operation in such circuit as alternating current circuits for which either the current waveform is predictable or the sinusoidal zero time points may be determined. In one embodiment, the switching apparatus of the present invention may be synchronously operated in the manner described in the above-referenced application Ser. No. 684,881.

One particularly useful application of the electrical current switching apparatus of the present invention is for synchronously operating electrical circuits which are connected to conventional 110 volt power lines. For such an application, each pair of switching contacts is further disposed so that, with the contacts in an open position, the distance therebetween is sufficient that the breakdown voltage between the contacts is greater than about 170 volts. The distance between the contacts is, at the same time, sufficiently small, and the benders and contacts have sufficiently small mass, that they are movable between the closed and open positions in a time period of less than about 200 microseconds. In one embodiment, the distance between the contacts in the open position is less than about 1 mil, and may be as small as 0.1 mil. Such a small separation between the contacts is much smaller than the contact separation for conventional relays designed for operation with 110 volt alternating current circuits. However, the present inventor has found that even for such short distances between the contacts, the dielectric strength of a piezoelectric switching device is sufficient for operation with typical 110 volt household power lines. Unexpectedly, sufficient breakdown voltage for such devices can be achieved even for contact separations as small as 0.1 mil. By Paschen's law the breakdown voltage between two electrodes in a gaseous atmosphere is a function of the product of gas pressure and the distance between the electrodes. For an electrode separation of 1 cm. in air at atmospheric pressure, the breakdown voltage can be determined to be approximately 30 kv. If this breakdown field of 30 kv/cm is used to estimate the breakdown voltage of a 1 mil electrode separation in air, as is permissible for separations of a few centimeters, the estimated breakdown voltage is 77 volts. However, it has been found that the breakdown voltage given by Paschen's law does not linearly decrease to zero as the contact separation becomes small, but rather approaches a minimum value and then begins to increase again. For air, this minimum breakdown voltage has been found to be somewhat greater than 300 volts. It is theorized that the reason for this minimum breakdown voltage and subsequent increase in dielectric strength is that, when the product of gas pressure and electrode separation is small, the number of gas atoms with which an electron can collide in traversing the gap between the contacts also becomes small. Since the breakdown process in a gas causes the gas to become an electrical conductor and therefore depends critically upon the ability of electrons in the gap to collide with and ionize ambient gas atoms, the probability of establishing a conducting path is reduced when the number of available target atoms is small. It is believed that the breakdown voltage approaches a minimum and then increases again because the breakdown process undergoes a fundamental change from a gas collision mechanism to an electrode-surface dominated, vacuum-breakdown mechanism, and also because the breakdown voltage of a given contact separation is generally much higher in vacuum than in a gas at atmospheric pressure. Accordingly, the present inventor has determined that a piezoelectric relay having a very small separation between the contacts may be synchronously operated so that 110 volt alternating current circuits are switched on and off with minimal arcing between the relay contacts.

Other particularly useful applications of the switching apparatus of the present invention are for synchronously operating electrical circuits of the type which are typically employed as control circuits for household appliances. Load circuit operating voltages for such applications range from as little as 24 volts to more than 340 volts. The load currents for these circuits include both alternating current and direct current waveforms. When the relay of the present invention is employed to switch direct current electrical loads, operation of the relay may be assisted by such conventional controlling means as, for example, voltage clamping circuitry. Finally, it should be noted that the switching apparatus of the present invention may be operated in air, in vacuum, or in an inert atmosphere, with the choice of operating environment being determined by the particular application involved. It should also be noted that the particularly useful applications for the switching apparatus of the present invention described above are provided by way of example, and are not intended to be limiting.

The foregoing describes a piezoelectrically actuated electrical current switching apparatus having increased contact separation when the switching contacts are in the open position, and increased contact closing force when the contacts are in the closed position. The present invention also provides a switching apparatus which is fast acting, small in size, highly energy efficient, and low in cost. Furthermore, the switching apparatus of the present invention is synchronously operable so that minimal arcing occurs between the switching contacts.

While the invention has been described in detail herein in accord with certain preferred embodiments thereof, many modifications and changes therein may be effected by those skilled in the art. For example, while benders 10 and 12 have been shown in the Figures as being configured so that they bend in the center in an inchworm fashion, benders 10 and 12 may also be configured so that they bend in a springboard fashion, without affecting the principles of this invention. Accordingly, it is intended by the appended claims to cover all such modifications and changes as fall within the true spirit and scope of the invention.

The invention claimed is:

1. A piezoelectrically actuated electrical current switching apparatus, comprising:

a pair of spaced-apart opposing multimorph piezoelectric benders, each of said benders being of the type exhibiting bending motion in a direction substantially perpendicular to the plane in which said bender lies in response to a first electrical signal and bending motion in the opposite direction in response to a second electrical signal;

each of said benders being fixed at a pair of opposing ends such that said bending motion comprises bowing proximate the center thereof; and at least one pair of electrical current switching contacts, one of said contacts of said pair being centrally mounted on one of the opposing surfaces of said pair of opposing benders and the second contact of said pair being centrally mounted on the second one of said opposing surfaces;

said pair of contacts and said piezoelectric benders being disposed so that in response to said first electrical signal said opposing benders bow toward each other and move said contacts to a closed position and so that in response to said second electrical signal said opposing benders bow away from each other and move said contacts to an open position.

2. The apparatus of claim 1 wherein said piezoelectric benders are further disposed so that the distance between said contacts in said open position is greater than the bending distance available from either of said piezoelectric benders alone.

3. The apparatus of claim 2 wherein said piezoelectric benders are disposed so that the distance between said contacts in the absence of any applied electrical signal is less than the sum of the bending distances available from said piezoelectric benders in response to said first electrical signal.

4. The apparatus of claim 3 wherein said piezoelectric benders are disposed so that the distance between said contacts in the absence of any applied electrical signal is one-half the sum of the bending distances available from said benders in response to said first electrical signal.

5. The apparatus of claim 1 wherein a plurality of said pairs of piezoelectric benders and said pairs of contacts are provided, configured so as to form a multi-pole single-throw switch.

6. A piezoelectrically actuated electrical current switching apparatus, comprising:

first, second and third multimorph piezoelectric benders of the type exhibiting bending motion in a direction substantially perpendicular to the plane in which said bender lies in response to a first electrical signal and bending motion in the opposite direction in response to a second electrical signal;

each of said benders being fixed at a pair of opposing ends such that said bending motion comprises bowing proximate the center thereof;

said second and third benders located on opposite sides of said first bender, each of said second and third benders being spaced apart from said first bender; and at least one set of four contacts, the first and second ones of said contacts being centrally mounted on said second and third benders, respectively, so that said contacts each face said first bender, a third one of said contacts being centrally mounted on the side of said first bender which faces said second bender, and the fourth one of said contacts being centrally mounted on the side of said first bender which faces said third bender;

said first bender being disposed with respect to said second and third benders so that in response to said first electrical signal said first and second benders bow towards each other and move said first and third contacts to a closed position while said first and third benders bow away from each other moving said second and fourth contacts to an open position and so that in response to said second electrical signal said first and third benders bow towards each other and move said second and fourth contacts to a closed position while said first and second benders bow away from each other moving said first and third contacts to an open position.

7. The apparatus of claim 6 wherein said piezoelectric benders are further disposed so that the distance between said first and third contacts in said open position is greater than the bending distance available from either of said first ad second piezoelectric benders alone and so that the distance between said second and fourth contacts in said open position is greater than the bending distance available from either of said first and third piezoelectric benders alone.

8. The apparatus of claim 7 wherein said piezoelectric benders are disposed so that in the absence of any applied electrical signal the distance between said first and third contacts is less than the sum of the bending distances available from said first and second piezoelectric benders in response to said first electrical signal and so that the distance between said second and fourth contacts is less than the sum of the bending distances available from said first and third piezoelectric benders in response to said second electrical signal.

9. The apparatus of claim 8 wherein said piezoelectric benders are disposed so that in the absence of any applied electrical signal the distance between said first and third contacts is one-half the sum of the bending distances available from said first and second piezoelectric benders in response to said first electrical signal and so that the distance between said second and fourth contacts is one-half the sum of the bending distances available from said first and third piezoelectric benders in response to said second electrical signal.

10. The apparatus of claim 6 wherein a plurality of said piezoelectric benders and said sets of four contacts are provided and configured so as to form a multi-pole double-throw switch.

11. A piezoelectrically actuated electrical current switching apparatus, comprising:

a contact mounting structure;

first and second multimorph piezoelectric benders, each of said benders being of the type exhibiting bending motion in a direction substantially perpendicular to the plane in which said bender lies in response to a first electrical signal and bending motion in the opposite direction in response to a second electrical signal, said first and second benders located on opposite sides of said contact mounting structure and spaced apart therefrom;

each of said benders being fixed at a pair of opposing ends such that said bending motion comprises bowing proximate the center thereof; and at least one set of four contacts, first and second ones of said contacts being centrally mounted on said first and second piezoelectric benders, respectively, so that said contacts each face said contact mounting structure, a third one of said contacts being mounted on the side of said contact mounting structure which faces said first piezoelectric bender, and the fourth one of said contacts being mounted on the side of said contact mounting structure which faces said second piezoelectric bender;

said contact mounting structure being disposed with respect to said first and second piezoelectric benders so that in response to said first electrical signal said first piezoelectric bender bows toward said contact mounting structure and said second piezoelectric bender bows away from said structure so as to move said first and third contacts to a closed position while moving said second and fourth contacts to an open position and so that in response to said second electrical signal said first piezoelectric bender bows away from said contact mounting structure and said second piezoelectric bender bows toward said structure so as to move said second and fourth contacts to a closed position while moving said first and third contacts to an open position.

12. The apparatus of claim 11 wherein said contact mounting structure is disposed with respect to said first and second piezoelectric benders so that in the absence of any applied electrical signal the distance between said first and third contacts is one-half the bending distance available from said first piezoelectric bender in response to said first electrical signal and so that the distance between said second and fourth contacts is one-half the bending distance available from said second piezoelectric bender in response to said second electrical signal.

* * * * *